United States Patent
Jeon et al.

(10) Patent No.: US 9,466,768 B2
(45) Date of Patent: *Oct. 11, 2016

(54) SEMICONDUCTOR LIGHT EMITTING DEVICE WITH A LIGHT-REFLECTING FACE

(71) Applicant: SEMICON LIGHT CO., LTD., Gyeonggi-do (KR)

(72) Inventors: Soo Kun Jeon, Gyeonggi-do (KR); Eun Hyun Park, Gyeonggi-do (KR)

(73) Assignee: SEMICON LIGHT CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/877,701

(22) PCT Filed: Jan. 14, 2013

(86) PCT No.: PCT/KR2013/000285
§ 371 (c)(1),
(2) Date: Apr. 4, 2013

(87) PCT Pub. No.: WO2013/105834
PCT Pub. Date: Jul. 18, 2013

(65) Prior Publication Data
US 2014/0217439 A1    Aug. 7, 2014

(30) Foreign Application Priority Data

Jan. 13, 2012  (KR) .......................... 10-2012-0004369
Jan. 10, 2013  (KR) .......................... 10-2013-0002945

(51) Int. Cl.
*H01L 33/38*    (2010.01)
*H01L 33/46*    (2010.01)

(52) U.S. Cl.
CPC ............. *H01L 33/46* (2013.01); *H01L 33/382* (2013.01)

(58) Field of Classification Search
CPC ........ H01L 33/38; H01L 33/42; H01L 33/46
USPC .............................. 257/98, E33.025, E33.072
See application file for complete search history.

(56) References Cited

U.S. PATENT DOCUMENTS

| 7,262,436 B2 | 8/2007 | Kondoh et al. |
| 7,982,236 B2 * | 7/2011 | Sano et al. ....................... 257/99 |

(Continued)

FOREIGN PATENT DOCUMENTS

| JP | 2006-120913 | 5/2006 | |
| JP | 2008-112957 | 5/2008 | ............. H01L 33/00 |

(Continued)

OTHER PUBLICATIONS

International Search Report and English translation issued in priority PCT Patent Application No. PCT/KR2013/000285 dated Apr. 23, 2013; 5 pgs.

*Primary Examiner* — Marcos D Pizarro
(74) *Attorney, Agent, or Firm* — Harness, Dickey & Pierce, P.L.C.

(57) ABSTRACT

The present disclosure relates to a semiconductor light-emitting device, comprising: a plurality of semiconductor layers grown sequentially using a growth substrate; a first electrode for providing either electrons or holes to a first semiconductor layer; a non-conductive reflective film formed over a second semiconductor layer to reflect light from an active layer towards the first semiconductor layer which is on the growth substrate side; and a finger electrode formed between the plurality of semiconductor layers and the non-conductive reflective film, which is extended so as to provide remaining electrons or holes to the second semiconductor layer, which is in electrical communication with the second semiconductor layer, and which has an electrical connection for receiving the remaining electrons or holes.

16 Claims, 13 Drawing Sheets

(56) References Cited

U.S. PATENT DOCUMENTS

| | | | |
|---|---|---|---|
| 8,373,188 B2* | 2/2013 | Suh et al. | 257/98 |
| 8,552,447 B2* | 10/2013 | Yahata et al. | 257/98 |
| 8,602,832 B2* | 12/2013 | Hsieh et al. | 445/24 |
| 2006/0145174 A1 | 7/2006 | Lee et al. | 257/98 |
| 2008/0185606 A1 | 8/2008 | Sano et al. | |
| 2009/0039374 A1 | 2/2009 | Yahata et al. | |
| 2011/0233589 A1 | 9/2011 | Kim et al. | 257/98 |
| 2012/0193674 A1 | 8/2012 | Jeon et al. | 257/99 |
| 2014/0231839 A1* | 8/2014 | Jeon et al. | H01L 33/46 257/96 |
| 2014/0291714 A1* | 10/2014 | Jeon et al. | H01L 33/46 257/98 |
| 2015/0236215 A1* | 8/2015 | Park et al. | H01L 33/387 257/98 |

FOREIGN PATENT DOCUMENTS

| | | | |
|---|---|---|---|
| JP | 2009-043934 | 2/2009 | |
| JP | 2009-088299 | 4/2009 | ............ H01L 33/00 |
| JP | 2009-164423 | 7/2009 | |
| JP | 2009-164506 | 7/2009 | ............ H01L 33/00 |
| JP | 2009-188422 | 8/2009 | ............ H01L 33/00 |
| JP | 2011-129766 | 6/2011 | ............ H01L 33/42 |
| KR | 10-0708934 | 4/2007 | ............ H01L 33/38 |
| KR | 2008-0072555 | 8/2008 | |
| KR | 2011-0011171 | 2/2011 | ............ H01L 33/64 |
| KR | 101069362 | 9/2011 | |
| KR | 2011-0107665 | 10/2011 | |
| KR | 2012-0002130 | 1/2012 | ............ H01L 33/10 |
| KR | 2012-0052746 | 5/2012 | ............ H01L 33/36 |
| KR | 2012-0053784 | 5/2012 | ............ H01L 33/50 |
| KR | 10-1182189 | 9/2012 | ............ H01L 33/36 |
| KR | 2012-0136814 | 12/2012 | ............ H01L 33/48 |

* cited by examiner

SEMICONDUCTOR LIGHT EMITTING DEVICE WITH A LIGHT-REFLECTING FACE

CROSS-REFERENCE TO RELATED APPLICATIONS

This application is a U.S. national stage filing under 35 U.S.C. §371 of International Application No. PCT/KR2013/000285 filed Jan. 14, 2013, and claims priority to Korean Application No. 10-2012-0004369 filed Jan. 13, 2012 and Korean Application No. 10-2013-0002945 filed Jan. 10, 2013. The disclosures of the aforementioned applications are incorporated herein by reference in their entireties.

FIELD

The present disclosure relates generally to a semiconductor light emitting device, and more particularly a semiconductor light emitting device having a light reflecting face.

Within the context herein, the term "semiconductor light emitting device" refers to a semiconductor optical device which generates light via electron-hole recombination, and one example is a group III-nitride semiconductor light emitting device. The group III-nitride semiconductor consists of a compound containing $Al_{(x)}Ga_{(y)}In_{(1-x-y)}N$ (wherein, $0 \leq x \leq 1$, $0 \leq y \leq 1$, $0 \leq x+y \leq 1$). Another example thereof is a GaAs-based semiconductor light emitting device used for red light emission.

BACKGROUND

This section provides background information related to the present disclosure which is not necessarily prior art.

FIG. 1 is a view illustrating an example of the semiconductor light emitting device proposed in U.S. Pat. No. 7,262,436. The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, while serving as reflective films, and an n-side bonding pad 800 formed on the n-type semiconductor layer 300 which has been etched and exposed. The n-type semiconductor layer 300 and the p-type semiconductor layer 500 can be of opposite conductive types. Preferably, a buffer layer (not shown) is provided between the substrate 100 and the n-type semiconductor layer 300. A chip having this structure, i.e. where all the electrodes 901, 902 and 903 and the n-side bonding pad 800 are formed on the opposite side of the substrate 100, with the electrodes 901, 902 and 903 serving as reflective films, is called a flip-chip. The electrodes 901, 902 and 903 are made up of an electrode 901 (e.g., Ag) with a high reflectance, an electrode 903 (e.g., Au) for bonding, and an electrode 902 (e.g., Ni) for preventing diffusion between materials of the electrode 901 and materials of the electrode 903. While this metal reflective film structure has a high reflectance and is advantageous for current spreading, it has a drawback that the metal absorbs light.

FIG. 2 is a view illustrating an example of the semiconductor light emitting device proposed in JP Pub. No. 2006-120913. The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light-transmitting conductive film 600 with a current spreading function formed on the p-type semiconductor layer 500, a p-side bonding pad 700 formed on the light-transmitting conductive film 600, and an n-side bonding pad 800 formed on the n-type semiconductor layer 300 which has been etched and exposed. Further, a DBR (Distributed Bragg Reflector) 900 and a metal reflective film 904 are provided on the light-transmitting conductive film 600. While this structure reduces light absorption by the metal reflective film 904, it has a drawback that current spreading is relatively poor, compared with the use of the electrodes 901, 902 and 903.

FIG. 12 is a view illustrating an example of the semiconductor light emitting device proposed in JP Pub. No. 2009-164423. In the semiconductor light emitting device, a DBR 900 and a metal reflective film 904 are provided on a plurality of semiconductor layers 300, 400 and 500, a phosphor 1000 is provided on opposite side thereof. The metal reflective film 904 and an n-side bonding pad 800 are electrically connected with external electrodes 1100 and 1200. The external electrodes 1100 and 1200 can be lead frames for a package, or electrical patterns provided on the COB (Chip on Board) or PCB (Printed Circuit Board). The phosphor 1000 can be coated conformally, or can be mixed with an epoxy resin and then used to cover the external electrodes 1100 and 1200. The phosphor 1000 absorbs light that is generated in the active layer, and converts this light to a light of longer or shorter wavelength.

DETAILED DESCRIPTION

Technical Problem

The problems to be solved by the present disclosure will be described in the latter part of the best mode for carrying out the invention.

Solution

This section provides a general summary of the present disclosure and is not a comprehensive disclosure of its full scope or all of its features.

According to one aspect of the present disclosure, there is provided a semiconductor light emitting device comprising: a plurality of semiconductor layers composed of a first semiconductor layer having first conductivity, a second semiconductor layer having second conductivity different from the first conductivity, and an active layer disposed between the first semiconductor layer and the second semiconductor layer, for generating light via electron-hole recombination, wherein the plurality of semiconductor layers are grown sequentially using a growth substrate; a first electrode for providing either electrons or holes to the first semiconductor layer; a non-conductive reflective film formed over the second semiconductor layer to reflect light from the active layer towards the first semiconductor layer which is on the growth substrate side; and a finger electrode formed between the plurality of semiconductor layers and the non-conductive reflective film, which is extended so as to provide the remaining electrons or holes to the second semiconductor layer, which is in electrical communication with the second semiconductor layer, which has an electrical connection for receiving the remaining electrons or holes.

3

Advantageous Effects

The advantageous effects of the present disclosure will be described in the latter part of the best mode for carrying out the invention.

MODE FOR CARRYING OUT INVENTION

Figure 3:
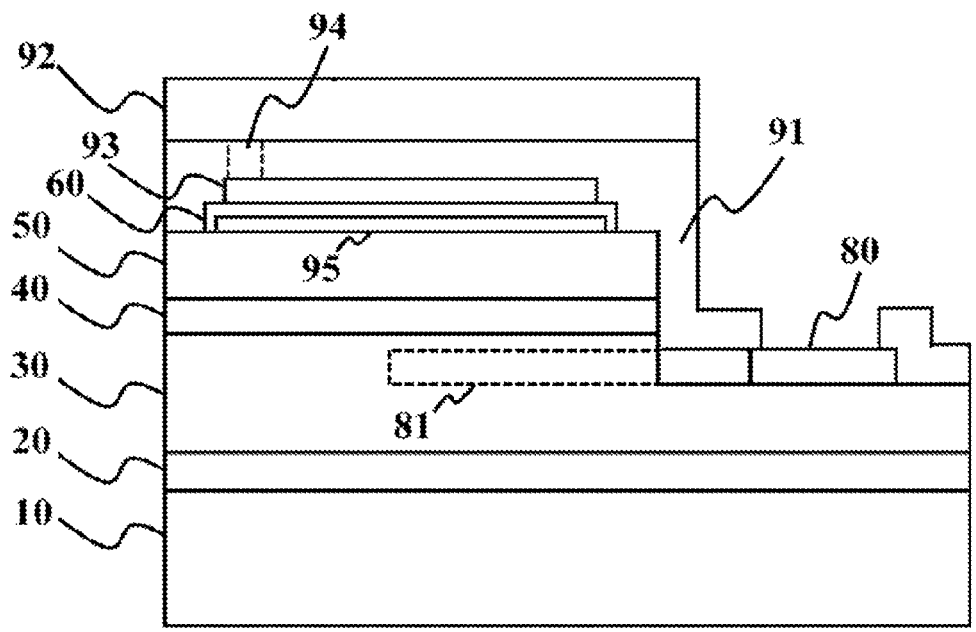
FIG. 3 to FIG. 5 are views illustrating an example of the semiconductor light emitting device according to the present disclosure.
Figure 4:
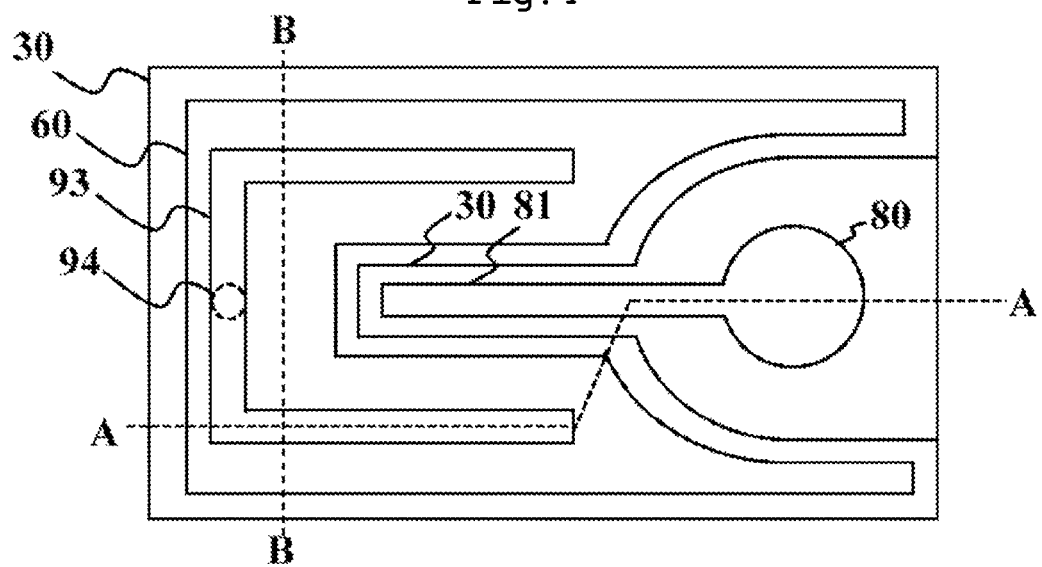
Figure 5:
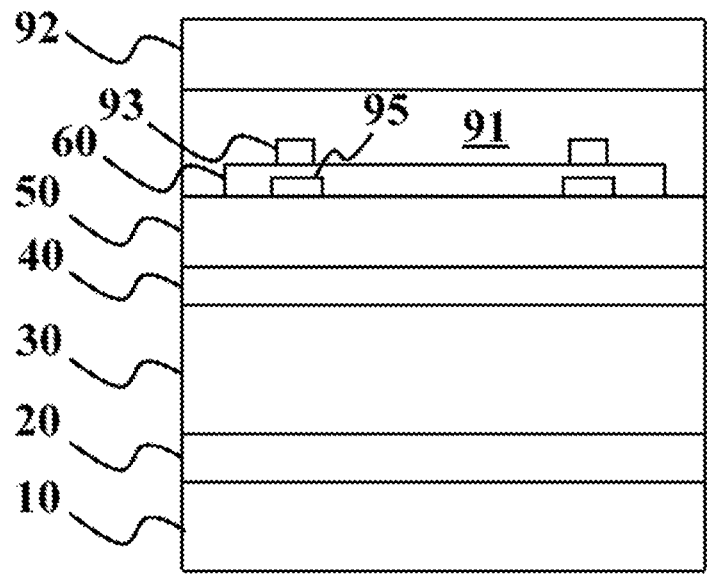

The present disclosure will now be described in detail with reference to the accompanying drawings FIG. 3 to FIG. 5 are views illustrating an example of the semiconductor light emitting device according to the present disclosure, in which FIG. 3 is a cross section view taken along line A-A of FIG. 4, and FIG. 5 is a cross section view taken along line B-B of FIG. 4. For the sake of convenient explanation, a non-conductive reflective film 91 and an electrode 92 are not shown in FIG. 4.

Figure 1:
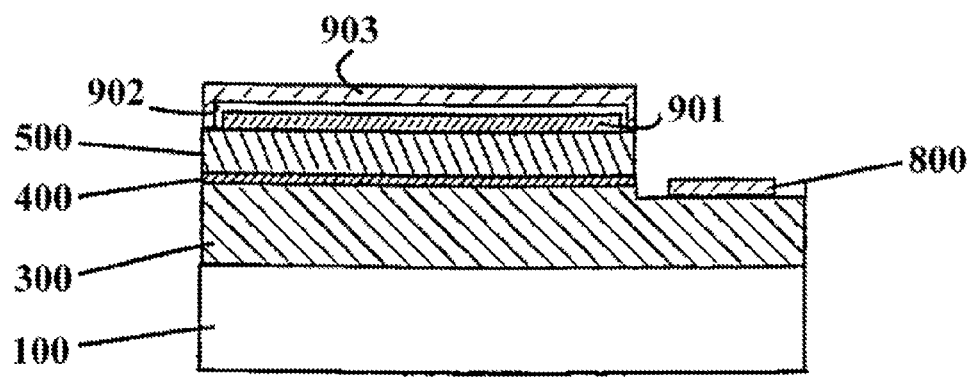
FIG. 1 is a view illustrating an example of the semiconductor light emitting device proposed in U.S. Pat. No. 7,262,436.
Figure 2:
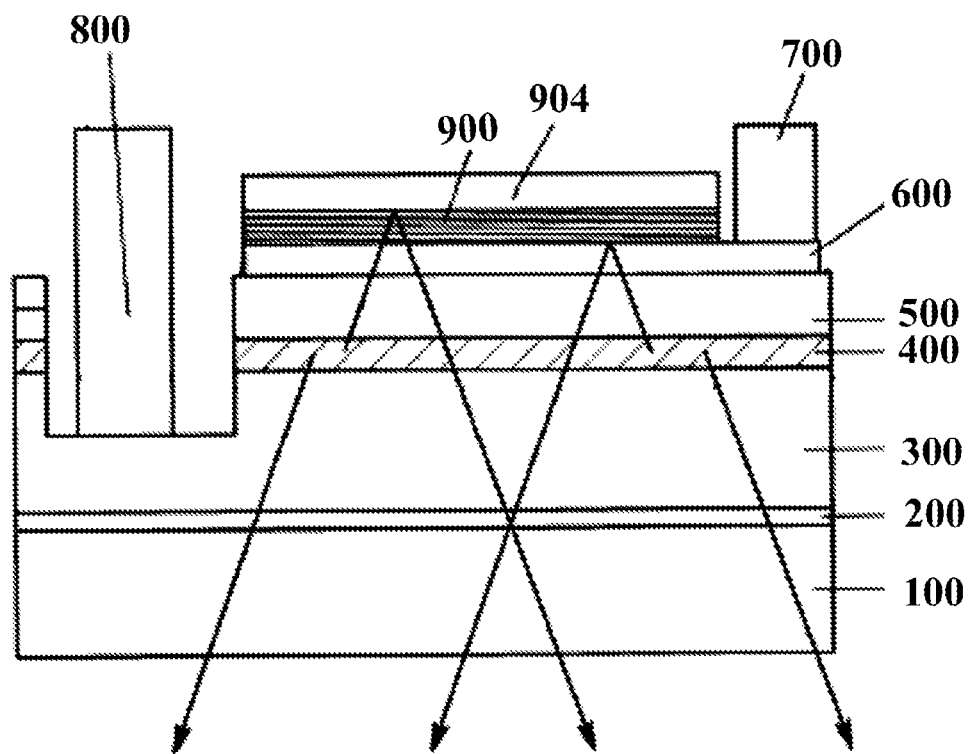
FIG. 2 is a view illustrating an example of the semiconductor light emitting device proposed in JP Pub. No. 2006-120913.
Figure 7:
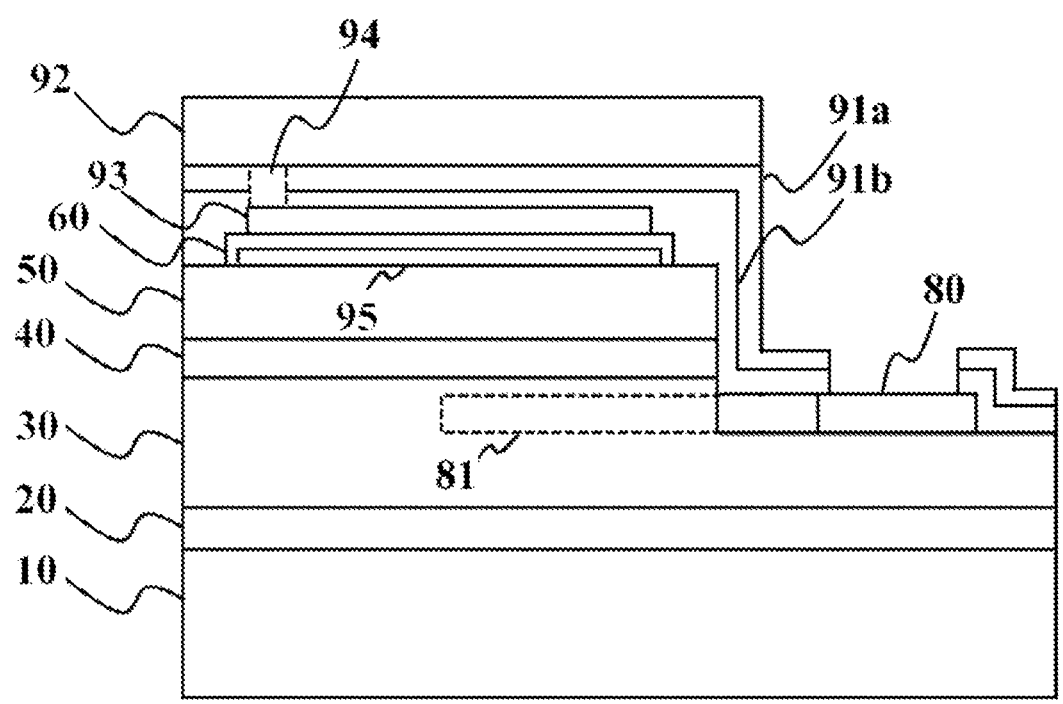
FIG. 7 is a view illustrating still another example of the semiconductor light emitting device according to the present disclosure.

The semiconductor light emitting device includes a substrate 10, a buffer layer 20 grown on the substrate 10, an n-type semiconductor layer 30 grown on the buffer layer 20, an active layer grown on the n-type semiconductor layer 30, for generating light via electron-hole recombination, and a p-type semiconductor layer 50 grown on the active layer 40. The substrate 10, which can eventually be removed, is mainly made in use of sapphire, SiC, Si, GaN or the like, and the buffer layer 20 can be omitted. When the substrate 10 is removed or has conductivity, an electrode 80 may be formed on the n-type semiconductor layer 30 side after the substrate 10 is removed therefrom, or on the conductive substrate 10 side. The positions of the n-type semiconductor layer 30 and the p-type semiconductor layer 50 can be changed with each other. For a group III nitride semiconductor light emitting device, those semiconductor layers are mainly made of GaN. Each of the semiconductor layers 20, 30, 40 and 50 can be configured in a plurality of sub layers, and the semiconductor light emitting device may also have an additional semiconductor layer. In addition to the electrode 80 that provides electrons to the n-type semiconductor layer 30, the semiconductor light emitting device includes an electrode 92 that provides holes to the p-type semiconductor layer 50. A finger electrode 81 extended into the n-type semiconductor layer 30 forms a part of the electrode 80. The electrode 80 may have an additional bump that makes the electrode 80 sufficiently high enough to be coupled with a package, or the electrode 80 per se may be deposited up to a height where it can be coupled with a package as shown in FIG. 2. In order to reflect light from the active layer 40 towards the substrate 10 used for the growth or towards the n-type semiconductor layer 30 if the substrate 10 has been removed, a non-conductive reflective film 91 is provided over the p-type semiconductor layer 50. Also, the non-conductive reflective film 91 may be formed over the n-type semiconductor layer 30 exposed by etching, and on a portion of the electrode 80. A person skilled in the art should understand that it is not absolutely necessary for the non-conductive reflective film 91 to cover the entire area over the semiconductor layers 30 and 50 on the opposite side of the substrate 10. The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid the light absorption. When the non-conductive reflective film 91 is composed of $SiO_x$, its refractive index is lower than that of the p-type semiconductor layer 50 (e.g., GaN) such that it can reflect part of the light having an incidence angle greater than a critical angle towards the semiconductor layers 30, 40 and 50. When the non-conductive reflective film 91 is composed of a DBR (e.g., DBR composed of the combination of $SiO_2$ and $TiO_2$), it can reflect a greater amount of light towards the semiconductor layers 30, 40 and 50. In FIG. 7, the non-conductive reflective film 91 has a double layer structure: a DBR 91a and a dielectric film 91b with a refractive index lower than that of the p-type semiconductor layer 50. As the deposition of the DBR 91a needs to be done with high precision, the dielectric film 91b having a uniform thickness is first formed before the deposition. As such, despite heterogeneous deposits 50, 60, 80, 81 and 93 of different forms which are present on the semiconductor layers 30, 40 and 50, the DBR 91b can be prepared in a stable manner, and light reflection can also benefit therefrom. The dielectric film 91b is suitably made of $SiO_2$ and it has a thickness suitably ranging from 0.2 μm to 1.0 μm. When the DBR 91a is composed of $TiO_2/SiO_2$, each layer is designed to have an optical thickness of one-fourth of a given wavelength, and the number of its combinations is suitably between 4 and 20 pairs. Considering that the electrode 92 contributes to reflecting light from the active layer 30 towards the substrate 10 or towards the n-type semiconductor layer 30, it is preferably a conductive reflective film that covers all or almost all of the non-conductive reflective film 91 over the p-type semiconductor layer 50. To this end, metals having a high reflectance, such as Al or Ag, may be utilized. A finger electrode 93 is extended between the non-conductive reflective film 91 and the p-type semiconductor layer 50, for supplying current (holes, to be precise) from the electrode 92 to the p-type semiconductor layer 50. The introduction of the finger electrode 93 provides a foundation for realizing a flip-clip that has overcome all the problems imposed by the flip-chips in FIG. 1 and FIG. 2. For electrical communication between the electrode 92 and the finger electrode 93 which are separated by the non-conductive reflective film 91 interposed between them, an electrical connection 94 is prepared in the vertical direction, passing through the non-conductive reflective film 91. Without the finger electrode 93, a number of electrical connections 94 will have to be connected directly to a light-transmitting conductive film 60 that is prepared on almost the entire face of the p-type semiconductor layer 50. In this case, however, it is not easy to form an acceptable electrical contact between the electrode 92 and the light-transmitting conductive film 60, and many problems might be created during the manufacturing process. In this regard, the present disclosure forms the finger electrode 93, prior to the formation of the non-conductive reflective film 91 and the electrode 92, on the p-type semiconductor layer 50 or preferably on the light-transmitting conductive film 60 and then performs thermal treatment on the finger electrode 93, such that a stable electrical contact can be created between both. Further, the finger electrode 93 has a height suitably ranging from 0.5 μm to 4.0 μm. If the finger electrode is thinner than the range, it can lead to an increased operating voltage; and if the finger electrode is thicker than the range, it can affect the stability of the process and increase the material cost. While Al or Ag having a high reflectance is a suitable material for the electrode 92, materials such as Cr, Ti, Ni or alloys thereof also may be suitable for the stable electrical contact. Accordingly, by introducing the finger electrode 93, it makes easy to meet the required design specifications. A person skilled in the art should understand that Al or Ag having a high reflectance can also be used for the finger electrode 93. As described above, the light-transmitting conductive film 60 is preferably provided. Especially in case of a p-type GaN, it has a poor current spreading capability. Also, when the p-type semiconductor layer 50 is composed of GaN, the light-transmitting conductive film 60 should be incorporated in most cases. For instance, materials such as ITO, Ni/Au or the like can be used for the light-transmitting conductive film 60. When the height of the finger electrode 93 reaches the electrode 92, the finger electrode 93 per se forms the electrical connection 94. Although it is possible to envisage configuring the electrode 92 with the same manner as a p-side bonding pad 700, it would not be desirable as the p-side bonding pad 700 absorbs light, and the area of the non-conductive reflective film 91 is reduced. A person skilled in the art should understand that the electrode 92 can also be formed by a mounting face at the package level, following the manufacturing of a chip. It should be noted that all of the components mentioned hitherto will suffice to form the semiconductor light emitting device according to the present disclosure. However, since part of the light generated in the active layer 40 can be absorbed by the finger electrode 93, to avoid this, it is preferable to provide a light-absorption preventing film 95 below the finger electrode 93. The light-absorption preventing film 95 may only serve to reflect part or all of the light generated in the active layer 40, or may only serve to prevent the current from the finger electrode 93 from flowing to immediately below zone of the finger electrode 93, or may serve both functions. To perform these functions, the light-absorption preventing film 95 can have a single layer (e.g., $SiO_2$) or a multilayer (e.g., $SiO_2/TiO_2/SiO_2$) that is made of a light-transmitting material(s) having a refractive index lower than that of the p-type semiconductor layer 50, or a DBR or any combination of the single layer and the DBR. In addition, the light-absorption preventing film 95 can be composed of a non-conductive material (e.g., a dielectric film such as $SiO_x$, $TiO_x$ or the like). Therefore, although it is not always required to form the light-absorption preventing film 95 with a light-transmitting material or with a non-conductive material, the effects thereof can be increased by incorporating a light-transmitting dielectric film.

Figure 6:
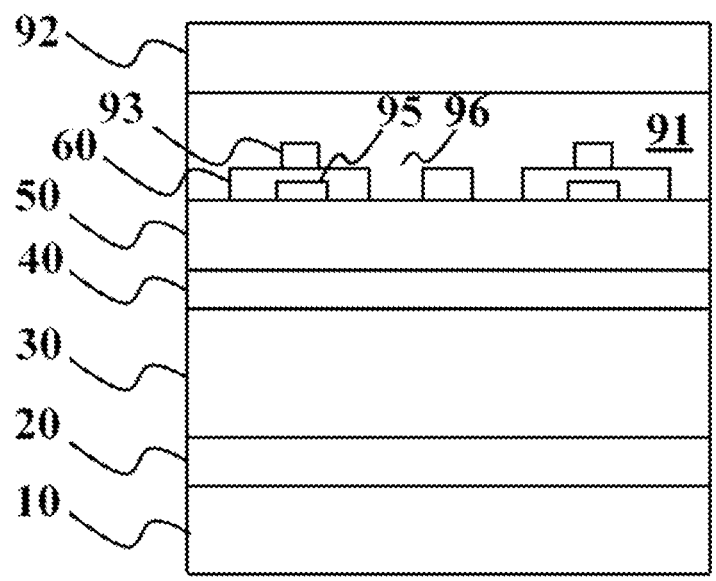
FIG. 6 is a view illustrating another example of the semiconductor light emitting device according to the present disclosure.

FIG. 6 is a view illustrating another example of the semiconductor light emitting device according to the present disclosure, in which a light-transmitting conductive film 60 has openings 96 to enable a non-conductive reflective film 91 to contact with a p-type semiconductor layer 50. The openings 96 can have any shape, including a plurality of islands, bands or the like. Even if the light-transmitting conductive film 60 is composed of most common ITO, it absorbs part of the light generated in the active layer 40. However, the formation of the openings 96 makes it possible to reduce the light absorption by the light-transmitting conductive film 60. While current spreading into the entire p-type semiconductor layer 50 might not be sufficient, it can be complemented by the finger electrode 93. No description will be provided for like reference numerals that have explained above.

Figure 8:
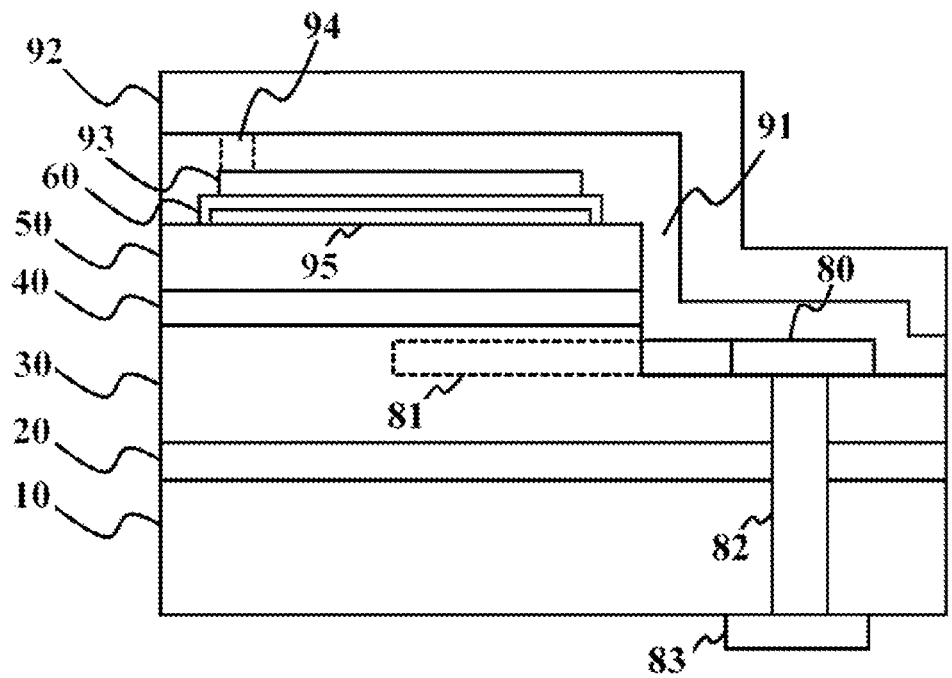
FIG. 8 is a view illustrating still another example of the semiconductor light emitting device according to the present disclosure.

FIG. 8 is a view illustrating still another example of the semiconductor light emitting device according to the present disclosure, which includes an electrical connection 82 passing through the substrate 10, the buffer layer 20 and the n-type semiconductor layer 30, and an electrode 83 on the substrate 10 or the n-type semiconductor layer 30 after the substrate 10 is removed therefrom, i.e. on the n-type semiconductor layer 30 side. This configuration enables to form a non-conductive reflective film 91 and an electrode 92 over the whole of plural semiconductor layers 30 and 50 on the opposite side of the substrate 10.

Figure 9:
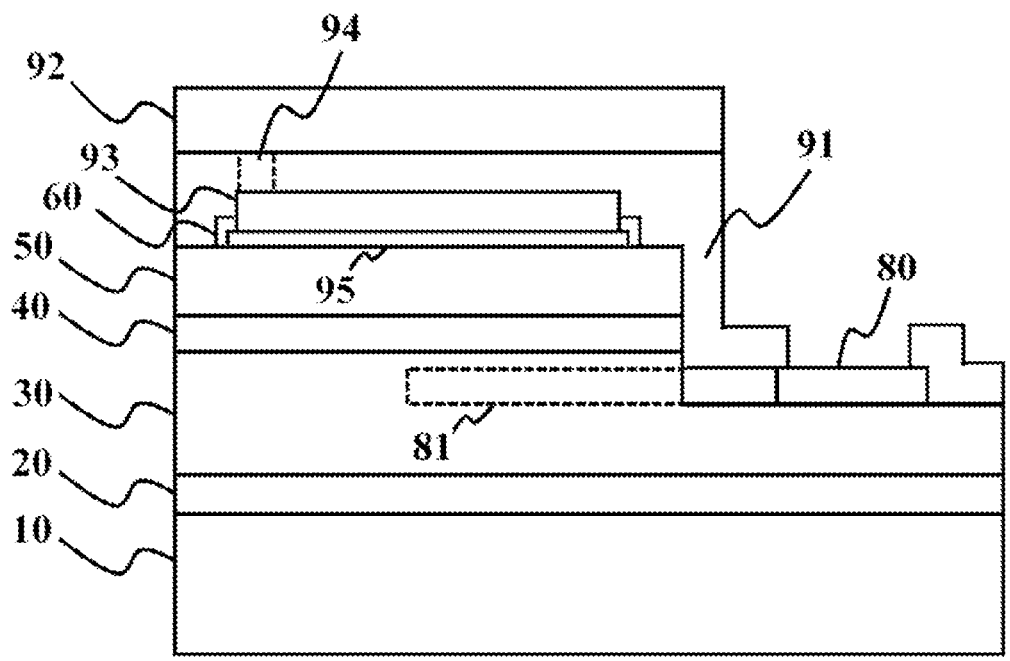
FIG. 9 and FIG. 10 are views illustrating further examples of the semiconductor light emitting device according to the present disclosure.
Figure 10:
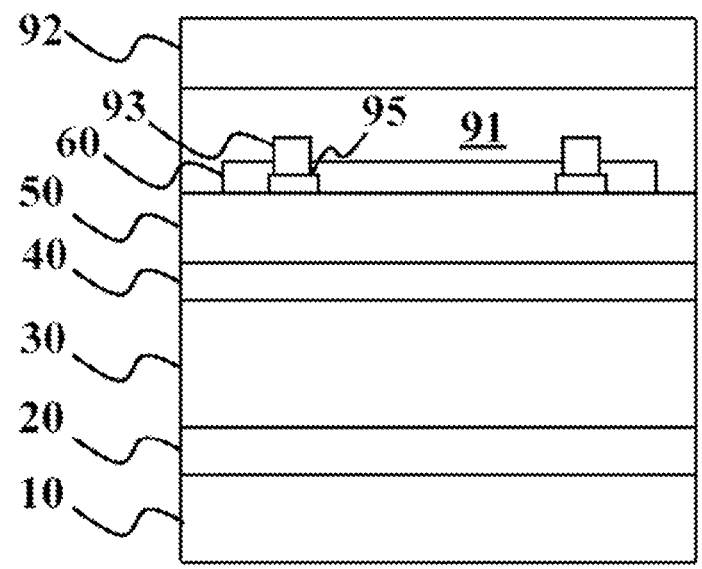

FIG. 9 and FIG. 10 are views illustrating further examples of the semiconductor light emitting device according to the present disclosure. In these examples, as the light-transmitting conductive film 60 is eliminated, the finger electrode 93 comes in direct contact with the light-absorption preventing film 95.

Figure 11:
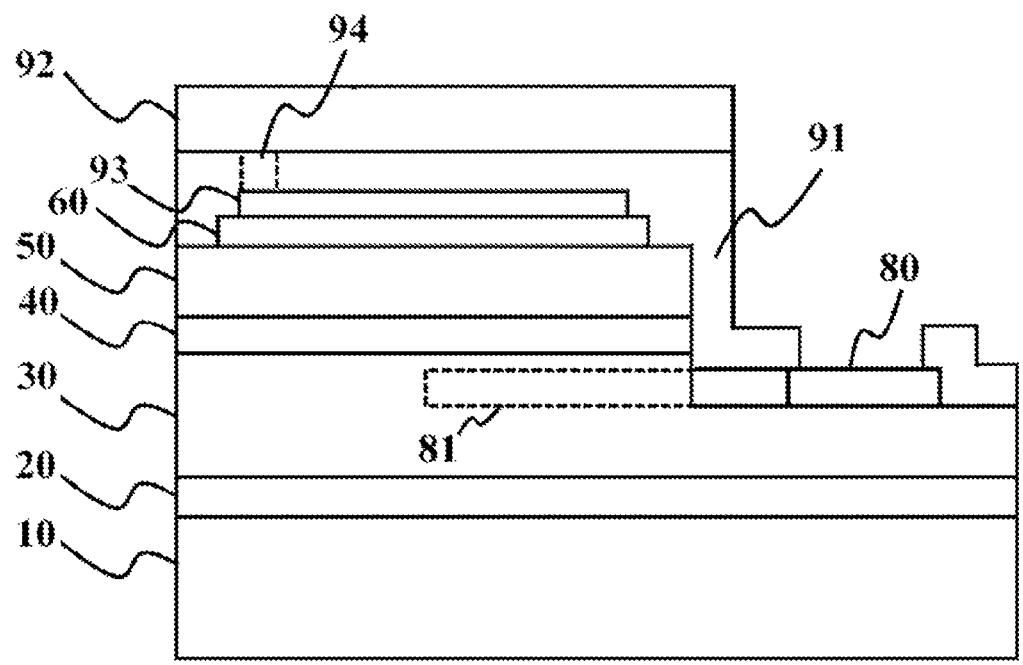
FIG. 11 is a view illustrating yet another example of the semiconductor light emitting device according to the present disclosure.
Figure 12:
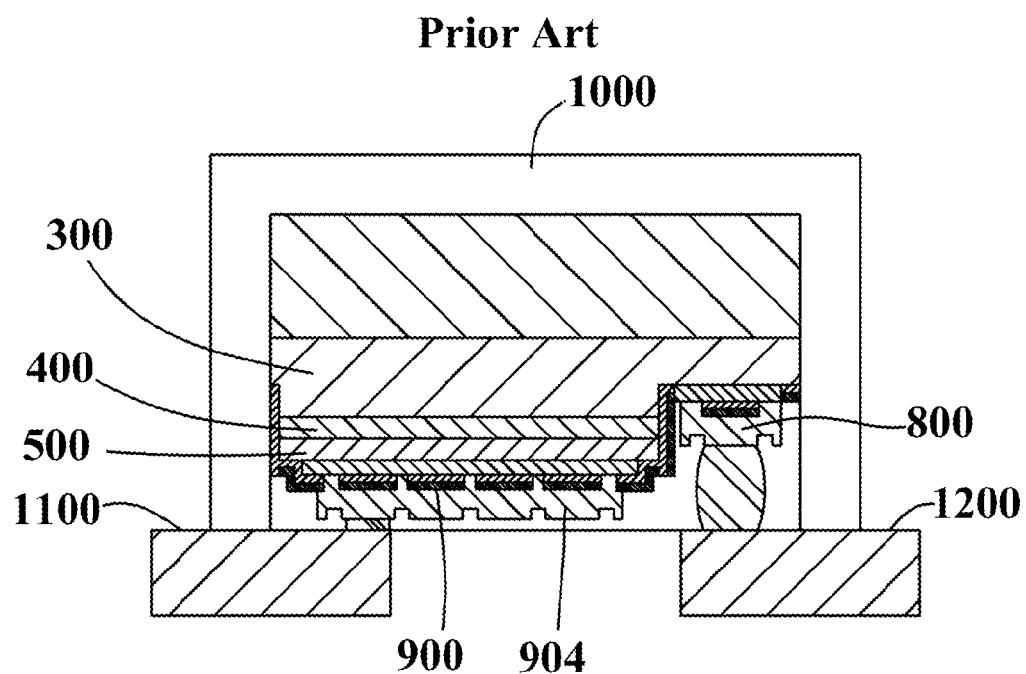
FIG. 12 is a view illustrating an example of the semiconductor light emitting device proposed in JP Pub. No. 2009-164423.

FIG. 11 is a view illustrating still another example of the semiconductor light emitting device according to the present disclosure. Unlike the example of FIG. 5, the semiconductor light emitting device does not includes the light-absorption preventing film 95.

Figure 13:
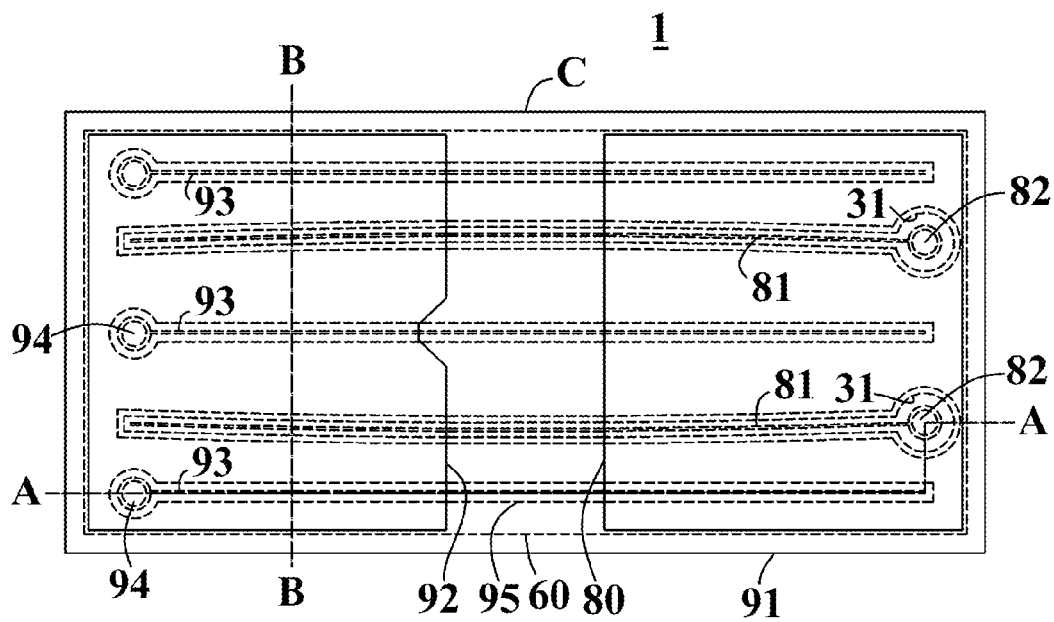
FIG. 13 is a view illustrating yet another example of the semiconductor light emitting device according to the present disclosure.
Figure 14:
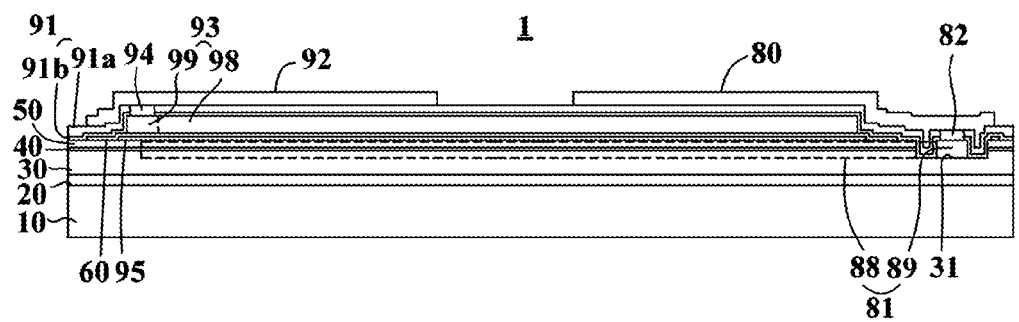
FIG. 14 is a cross section view taken along line A-A of FIG. 13.
Figure 15:
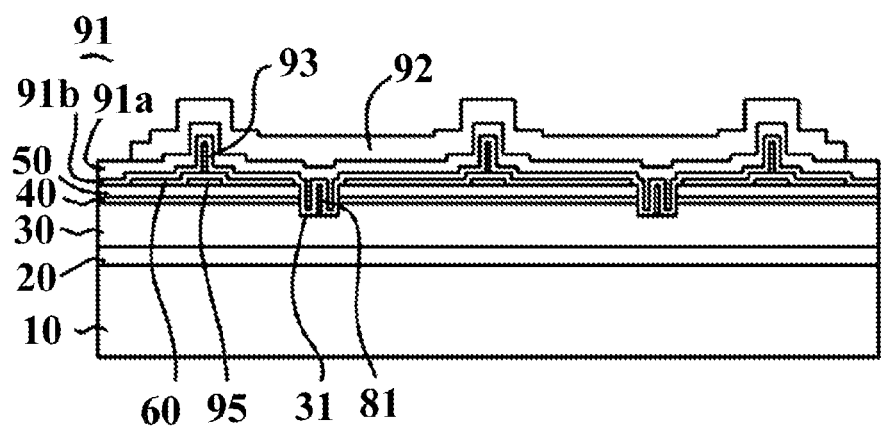
FIG. 15 is a cross section view taken along line B-B of FIG. 13.
Figure 16:
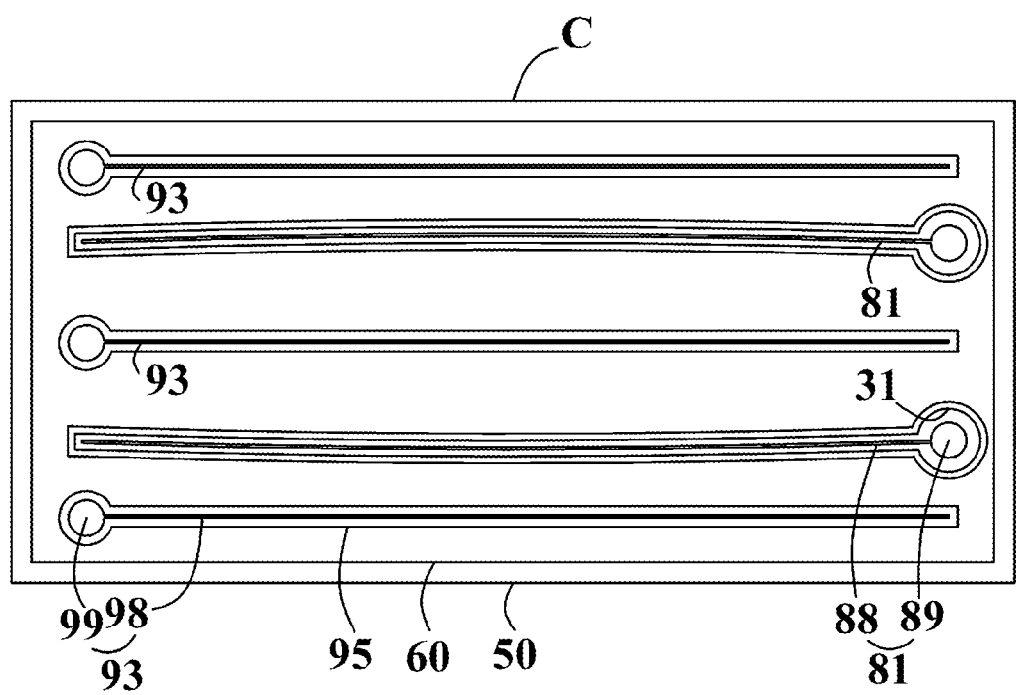
FIG. 16 is a view illustrating the semiconductor light emitting device of FIG. 13, without the p-side and n-side electrodes and the non-conductive reflective film.

FIG. 13 is a view illustrating yet another example of the semiconductor light emitting device according to the present disclosure, FIG. 14 is a cross section view taken along line A-A of FIG. 13, and FIG. 15 is a cross section view taken along line B-B of FIG. 13. FIG. 16 is a view illustrating the semiconductor light emitting device of FIG. 13, without the p-side and n-side electrodes and the non-conductive reflective film.

The semiconductor light emitting device 1 includes a substrate 10, a buffer layer 20 grown on the substrate 10, an n-type semiconductor layer 30 grown on the buffer layer 20, an active layer 40 grown on the n-type semiconductor layer 30, for generating light via electron-hole recombination, and a p-type semiconductor layer 50 grown on the active layer 40.

The substrate 10, which can eventually be removed, is mainly made in use of sapphire, SiC, Si, GaN or the like, and the buffer layer 20 can be omitted. When the substrate 10 is removed or has conductivity, an n-side electrode 80 may be formed on the n-type semiconductor layer 30 side after the substrate 10 is removed therefrom, or on the conductive substrate 10 side. The positions of the n-type semiconductor layer 30 and the p-type semiconductor layer 50 can be changed with each other. For a group III nitride semiconductor light emitting device, those semiconductor layers are mainly made of GaN. Each of the semiconductor layers 20, 30, 40 and 50 can be configured in a plurality of sub layers. The semiconductor light emitting device may also have an additional semiconductor layer.

Portions of the p-type semiconductor layer 50 and the active layer 40 are removed by a mesa etching process to form two n-side contact areas 31 where the n-type semiconductor layer 30 is exposed. An n-side finger electrode 81 is then formed on the n-type semiconductor layer 30 within each n-side contact area 31. The n-side contact areas 31 are extended in parallel with one side C of the semiconductor light emitting device. While the n-side contact areas 31 may be open to one of the lateral directions of the semiconductor light emitting device, they are preferably enclosed and blocked by the active layer 40 and the p-type semiconductor layer 50 without being open to any one of the lateral directions. The number of the n-side contact areas 31 may be higher or lower, and the array configuration thereof can be varied. The n-side finger electrode 81 preferably includes a branch portion 88 extended lengthily, and a connecting portion 89 formed at one end of the branch portion 88 and having a greater width. As such, the n-side contact area 31 has a smaller width at the part where the branch portion 88 of the n-side finger electrode 81 is disposed and a greater width at the part where the connecting portion 89 of the n-side finger electrode 81 is disposed.

Three p-side finger electrodes 93 are formed on the p-type semiconductor layer 50. The p-side finger electrodes 93 are formed in parallel with the n-side finger electrodes 81, in which one of the p-side finger electrodes is arranged between two n-side finger electrodes 81 and the other two p-side finger electrodes are arranged on both sides of the n-side finger electrodes, respectively. Thus, the n-side finger electrodes 81 are placed among the p-side finger electrodes 93, respectively, in an alternate manner. Also, the p-side finger electrode 93 preferably includes a branch portion 98 extended lengthily, and a connecting portion 99 formed at one end of the branch portion 98 and having a greater width. Meanwhile, as shown in FIG. 13, the connecting portion 99 of the p-side finger electrode 93 is placed on the opposite side of the connecting portion 89 of the n-side finger electrode 81, when the semiconductor light emitting device is seen from the top. That is to say, the connecting portion 99 of the p-side finger electrode 93 is placed on the left side, while the connecting portion 89 of the n-side finger electrode 81 is placed on the right side. The p-side finger electrode 93 extended along the direction of one side C of the semiconductor light emitting device. For instance, in FIG. 13 and FIG. 16, it is extended from the left side to the right side. With these extended lengthily, plural p-side finger electrodes 93, the device can be placed on a mounting part (e.g., a sub-mount, a package, or a COB (Chip on Board)) in an upside-down position without slopingness. In this regard, it is preferable to form the p-side finger electrode 93 as long as possible.

A suitable height for the p-side finger electrodes 93 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Preferably, prior to the formation of the p-side finger electrode 93, a light-absorption preventing film 95 is formed on the p-type semiconductor layer 50 on which the p-side finger electrode 93 is supposed to be formed. The light-absorption preventing film 95 is formed in such a way that it is slightly wider than the p-side finger electrode 93. The light-absorption preventing layer 95 serves to prevent the p-side finger electrode 93 from absorbing light that is generated in the active layer 40. The light-absorption preventing film 95 may only serve to reflect part or all of the light generated in the active layer 40, or may only serve to prevent the current from the finger electrode 93 from flowing to immediately below zone of the finger electrode 93, or may serve both functions. To perform these functions, the light-absorption preventing film 95 can be composed of a single layer (e.g., $SiO_2$) or a multilayer (e.g., $SiO_2/TiO_2/SiO_2$) that is made of a light-transmitting material having a refractive index lower than that of the p-type semiconductor layer 50, or a DBR or a combination of the single layer and the DBR. In addition, the light-absorption preventing film 95 can be composed of a non-conductive material (e.g., a dielectric film such as $SiO_x$, $TiO_x$ or the like). Depending on the structure, a suitable thickness for the light-absorption preventing film 95 is between 0.2 μm and 3.0 μm. If the light-absorption preventing film 95 is thinner than the range, it cannot function properly; and if the light-absorption preventing film 95 is thicker than the range, it can be difficult to deposit the light-transmitting conductive film 60 on the light-absorption preventing film 95. Although the light-absorption prevention film 95 does not always have to be composed of a light-transmitting material or of a non-conductive material, the effects thereof can be increased by incorporating a light-transmitting dielectric material.

Preferably, following the formation of the light-absorption preventing film 95 and prior to the formation of the p-side finger electrode 93, the light-transmitting conductive film 60 is formed on the p-type semiconductor layer 50. The light-transmitting conductive film 60 is formed on the p-type semiconductor layer 50 in such a way that it covers almost the entire p-type semiconductor layer, except for the n-side contact area 31 that is formed by a mesa etching process. As such, the light-absorption preventing film 95 is disposed between the light-transmitting conductive film 60 and the p-type semiconductor layer 50. Especially in case of a p-type GaN, it has a poor current spreading capability. Also, when the p-type semiconductor layer 50 is composed of GaN, the light-transmitting conductive film 60 should be incorporated in most cases. For instance, materials such as ITO, Ni/Au or the like can be used for the light-transmitting conductive film 60. After the light-transmitting conductive film 60 is formed, the p-side finger electrode 93 can be formed on the light-transmitting conductive film 60 where the light-absorption preventing film 95 is placed.

Following the formation of the n-side finger electrode 81 and the p-side finger electrode 93, a non-conductive reflective film 91 is formed in such a way that the n-side contact area 31 including the n-side finger electrode 81 and the p-type semiconductor layer 50 including the p-side finger electrode 93 are covered overall. The non-conductive reflective film 91 serves to reflect light from the active layer 40 towards the substrate 10 used for the growth or towards the n-type semiconductor layer 30 if the substrate 10 has been removed. Preferably, the non-conductive reflective film 91 also covers the exposed side faces of the p-type semiconductor layer 50 and the active layer 40 that connect the upper face of the p-type semiconductor layer 50 and the upper face of the n-side contact area 31. A person skilled in the art should understand that it is not absolutely necessary for the non-conductive reflective film 91 to cover the entire area over the exposed n-type semiconductor layer 30 as a result of etching and the p-type semiconductor layer 50 on the opposite side of the substrate 10.

The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid the light absorption. The non-conductive reflective film 91 can have a variety of structures, including a single dielectric film for example made of a light-transmitting dielectric material such as $SiO_x$, a single DBR for example including the combination of $SiO_2$ and $TiO_2$, heterogeneous plural dielectric films and any combination of a dielectric film and a DBR, and can have a thickness ranging from 3 to 8 μm, for example. The dielectric film having a refractive index lower than that of the p-type semiconductor layer 50 (e.g., GaN) can reflect part of the light having an incidence angle greater than a critical angle towards the substrate 10, the DBR can reflect a greater amount of light towards the substrate 10, and the DBR can also be designed for a specific wavelength such that it can effectively reflect light in response to the wavelength of the light generated.

Preferably, as shown in FIG. 14 and FIG. 15, the non-conductive reflective film 91 has a double layer structure including a DBR 91a and a dielectric film 91b. As the deposition of the DBR 91a needs to be done with high precision, the dielectric film 91b having a uniform thickness is first formed before the deposition such that the DBR 91b can be prepared in a stable manner, and light reflection can also benefit therefrom.

During the formation of a semiconductor light emitting device according to the present disclosure, a step (step-shape portion) having height difference can be created by a mesa etching process for forming the n-side contact area 31, a component such as the p-side finger electrode 93 or the n-side finger electrode 81 with a step is required, and even after the non-conductive reflective film 91 is formed, it should be subjected to a boring process to make an opening in it as described in detail below. Thus, special attention should be paid during the formation of the dielectric film 91b.

The dielectric film 91b is suitably made of $SiO_2$, and it preferably has a thickness between 0.2 μm and 1.0 μm. If the dielectric film 91b is thinner than the range, it is not enough to fully cover the n-side finger electrode 81 and p-side finger electrode 93 having a height ranging from 2 μm to 3 μm; and if the dielectric film 91b is thicker than the range, the subsequent boring process can be difficult to perform. The dielectric film 91b may be thicker than the following DBR 91a. Moreover, it is necessary to form the dielectric film 91b by a more suitable method for ensuring the reliability of the device. For instance, the dielectric film 91b made of $SiO_2$ is preferably formed by CVD (Chemical Vapor Deposition) and in particular by PECVD (Plasma Enhanced CVD). This is because the steps are created during the formation of the n-side contact area 31 by mesa etching, the p-side finger electrode 93 and the n-side finger electrode 81, and because the CVD is more advantageous than PVD (Physical Vapor Deposition) such as E-beam evaporation to cover the steps. More specifically, when the dielectric film 91b is formed by E-beam evaporation, the dielectric film 91b can be formed more thinly on the lateral faces of the p-side finger electrode 93 and n-side finger electrode 81 having the step, or on the tilted step face generated by mesa etching. Meanwhile, if a thinner dielectric film 91b is formed on the step faces, and especially if the p-side finger electrode 93 and the n-side finger electrode 81 are placed below the p-side electrode 92 and the n-side electrode 80 respectively as described below, a short might occur between the electrodes. Therefore, in order to ensure insulation, the dielectric film 91b is preferably formed by CVD. In this way, it is possible to secure the reliability of the semiconductor light emitting device, while ensuring those functions as the non-conductive reflective film 91.

The DBR 91a is formed on the dielectric film 91b and compose the non-conductive reflective film 91, together with the dielectric film 91b. For example, the DBR 91a having a repeatedly laminated structure composed of the combination of $TiO_2/SiO_2$ is preferably formed by PVD, and in particular by E-beam evaporation, sputtering or thermal evaporation. When the DBR 91a is composed of the combination of $TiO_2/SiO_2$, each layer is designed to have an optical thickness of one fourth of a given wavelength, and the number of its combinations is suitably between 4 and 20 pairs. If the number of pairs is smaller than the range, the reflectivity of the DBR 91a may be degraded; and if the number of pairs is larger than the range, the DBR 91a may become excessively thick.

With the non-conductive reflective film 91 thus formed, the p-side finger electrode 93 and the n-side finger electrode 81 are fully covered by the non-conductive reflective film 91. To enable the p-side finger electrode 93 and the n-side finger electrode 81 to electrically communicate with the p-side electrode 92 and the n-side electrode 80 described below, openings passing through the non-conductive reflective film 91 are formed, and the openings are then filled with an electrode material to form electrical connections 94 and 82. These openings are preferably formed by dry etching or wet etching or both. As the p-side finger electrode 93 and the n-side finger electrode 81 have narrow-width branch portions 98 and 88 respectively, the electrical connections 94 and 82 are preferably formed on the connecting parts 99 and 89 of the p-side finger electrode 93 and the n-side finger electrode 81, respectively. In absence of the p-side finger electrode 93, a number of electrical connections 94 should be formed and connected directly to the light-transmitting conductive film 60 that is prepared on almost the entire face of the p-type semiconductor layer 50. Likewise, in absence of the n-side finger electrode 81, a number of electrical connections 82 should be formed and connected directly to the n-side contact area 31. However, it is difficult to form a satisfactory electrical contact between the p-side electrode 92 and the light-transmitting conductive film 60 and between the n-side electrode 80 and the n-type semiconductor layer 30, and many problems also occur during the manufacturing process. Meanwhile, according to the present disclosure, prior to the formation of the non-conductive reflective film 91, the n-side finger electrode 81 is formed on the n-side contact area 31, and the p-side finger electrode 93 is formed either on the p-type semiconductor layer 50 or preferably on the light-transmitting conductive film 60, and these electrodes are then subjected to heat treatment, thereby making a stable electrical contact between both sides.

Once the electrical connections 94 and 82 are formed, it is desirable to form the p-side electrode 92 and the n-side electrode 80 on the non-conductive reflective film 91. Considering that the p-side electrode 92 and the n-side electrode 80 contribute to reflecting light from the active layer 40 towards the substrate 10, those electrodes are formed over a broad area to be able to cover the entire or almost the entire upper face of the non-conductive reflective film 91, thereby serving as a conductive reflective film. However, the p-side electrode 92 and the n-side electrode 80 are preferably formed at a distance from each other on the non-conductive reflective film 91. As such, there exists a portion on the non-conductive reflective film 91, which is covered neither by the p-side electrode 92 nor by the n-side electrode 80. While the p-side electrode 92 or the n-side electrode 80 may suitably be made of a material having a good reflectance (e.g., Al, Ag or the like), it is preferably made of the combination of the high-reflectance material (e.g., Al, Ag or the like) and Cr, Ti, Ni, Au or any alloy thereof for obtaining a stable electrical contact. The p-side electrode 92 and the n-side electrode 80 serve to supply current to the p-side finger electrode 93 and the n-side finger electrode 82; to connect the semiconductor light emitting device with external equipment; and, by occupying a broad area, to reflect the light from the active layer 40 and/or emit the heat. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light emitting device according to the present disclosure is bonded to a mounting part (e.g., a sub-mount, a package or a COB). This advantage becomes more apparent especially when the eutectic bonding method is applied.

As the p-side electrode 92 and the n-side electrode 80 are formed over a broad area on the non-conductive reflective film 91, both the p-side finger electrode 93 and the n-side finger electrode 81 are placed beneath the non-conductive reflective film 91. Here, the p-side finger electrode 93 extends lengthily passing below the n-side electrode 80 placed directly on the non-conductive reflective film 91, and the n-side finger electrode 81 extends lengthily passing below the p-side electrode 92 placed directly on the non-conductive reflective film 91. As the non-conductive reflective film 91 exists between the p-side electrode 92 and the p-side finger electrode 93, and between the n-side electrode 80 and the n-side finger electrode 81, a short between the electrodes 92 and 80 and the finger electrodes 93 and 81 can be prevented. Further, by introducing the p-side finger electrode 93 and the n-side finger electrode 81 as described above into the formation of a flip-chip, it becomes possible to supply current to the semiconductor layer areas of interest, without restriction.

In general, the p-side electrode 92, the n-side electrode 80, the p-side finger electrode 93 and the n-side finger electrode 81 are composed of a plurality of metal layers, respectively. In case of the p-side finger electrode 93, the bottom layer thereof should have a high bonding strength with the light-transmitting conductive film 60. To this end, materials such as Cr or Ti are mainly used, but other materials such as Ni, Ti or TiW can also be used as there are no particular limitations regarding this matter. A person skilled in the art should understand that Al or Ag having a high reflectance can also be employed for the p-side finger electrode 93 and the n-side finger electrode 81. In case of the p-side electrode 92 and the n-side electrode 80, Au is used for their top layers for wire bonding or for the connection with an external electrode. Meanwhile, in order to reduce the amount of Au used and to complement a relatively low hardness of Au, other material such as Ni, Ti, TiW or W, depending on the specifications required, or Al or Ag, when a high reflectance is required, can be employed between the bottom layer and the top layer. In the present disclosure, since the p-side finger electrode 93 and the n-side finger electrode 81 need to be electrically connected to the electrical connections 94 and 82, Au could be considered for use as the top layers for finger electrodes 93 and 81. However, the inventors found out that it is not appropriate to use Au as the top layers for the p-side finger electrode 93 and the n-side finger electrode 81, because the Au gets easily peeled off due to a weak bonding strength between the Au and the non-conductive reflective film 91 at the time of deposition of the non-conductive reflective film 91 onto the Au top layer. To resolve this problem, other material such as Ni, Ti, W, TiW, Cr, Pd or Mo can be employed in replace of Au to form the top layers of the finger electrodes. In this way, the bonding strength between the top layers and the non-conductive reflective film 91 to be deposited on the top layers is retained and the reliability can thus be improved. Further, those metals mentioned above are fully capable of functioning as a diffusion barrier during the formation of an opening in the non-conductive reflective film 91 to create the electrical connection 94, which can be helpful for ensuring the stability of the subsequent processes and the electrical connects 94 and 82.

Figure 17:
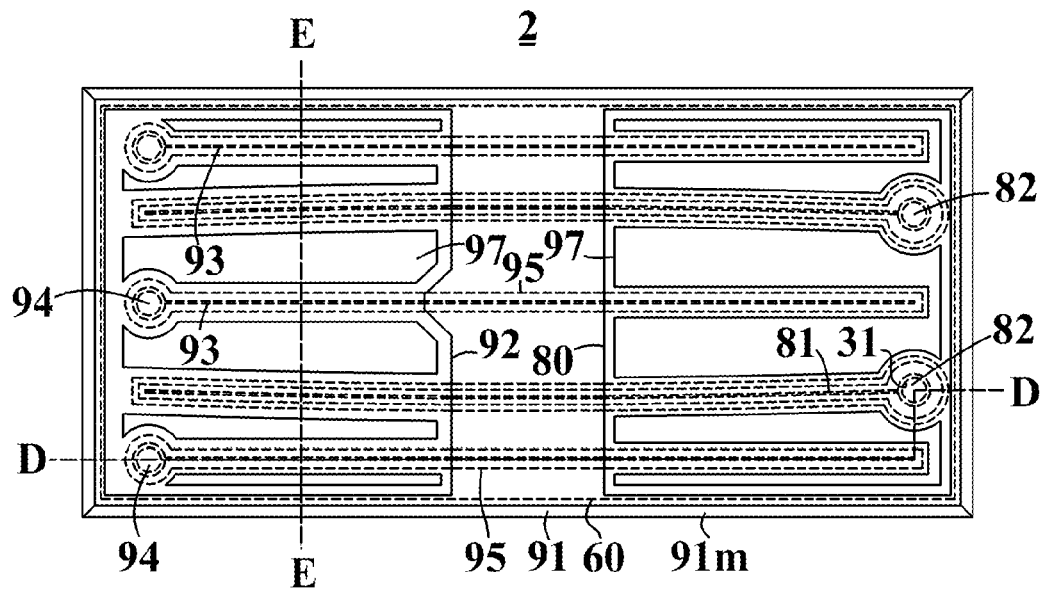
FIG. 17 is a view illustrating yet another example of the semiconductor light emitting device according to the present disclosure.
Figure 18:
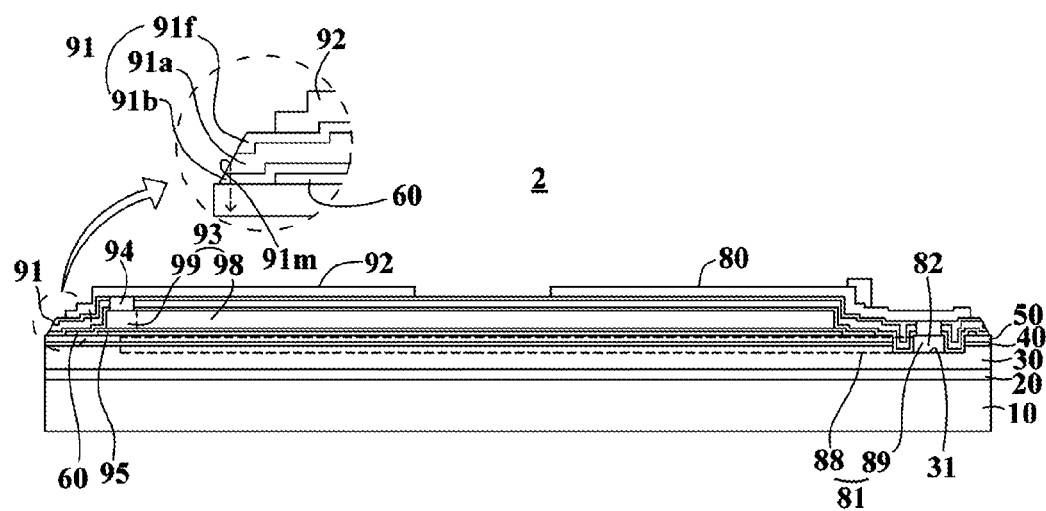
FIG. 18 is a cross section view taken along line D-D of FIG. 17.
Figure 19:
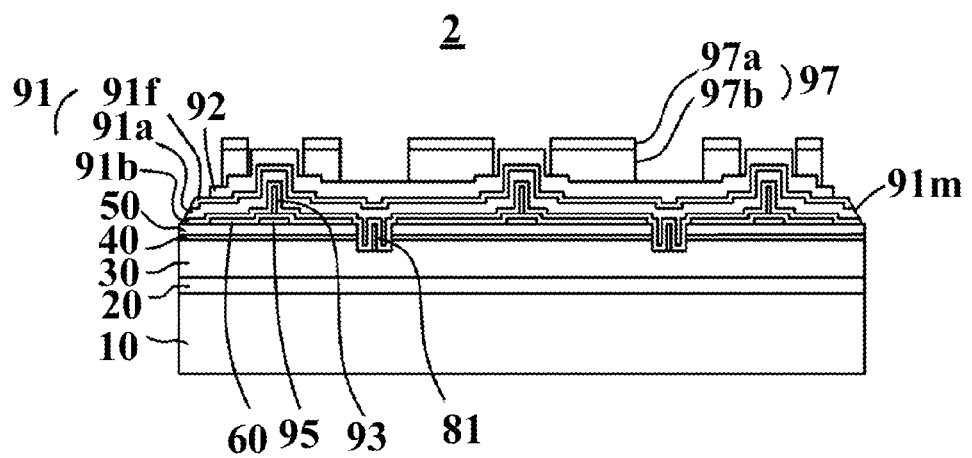
FIG. 19 is a cross section view taken along line E-E of FIG. 17.

FIG. 17 is a view illustrating yet another example of the semiconductor light emitting device according to the present disclosure, FIG. 18 is a cross section view taken along line D-D of FIG. 17, and FIG. 19 is a cross section view taken along line E-E of FIG. 17.

In a semiconductor light emitting device 2 according to the present disclosure, as shown in FIG. 18 and FIG. 19, a non-conductive reflective film 91 further includes, in addition to a dielectric film 91*b* and a DBR 91*a*, a clad film 91*f* to be formed on the DBR 91*a*. Although a large portion of light generated in the active layer 40 is reflected by the dielectric film 91*b* and the DBR 91*a* towards an n-side semiconductor layer 30, part of the light is trapped inside the dielectric film 91*b* and the DBR 91*a* as they also have a certain thickness, or emitted through the lateral faces of the dielectric film 91*b* and the DBR 91*b*. The inventors tried to analyze the relationships among the dielectric film 91*b*, the DBR 91*a* and the clad film 91*f*, from the perspective of an optical waveguide. The optical waveguide is a structure that encloses a propagation part of light by a material having a refractive index lower than that of the propagation part of light and guides the light utilizing total reflection. In this regard, if the DBR 91*a* is considered as the propagation part, the dielectric film 91*b* and the clad film 91*f* can be regarded as part of the structure that encloses the propagation part. When the DBR 91*a* is composed of $SiO_2/TiO_2$, with $SiO_2$ having a refractive index of 1.46 and $TiO_2$ having a refractive index of 2.4, an effective refractive index (which means an equivalent refractive index of light that can travel in a waveguide that is made of materials having different refractive indices, and has a value between 1.46 and 2.4) of the DBR 91*a* is higher than that of the dielectric film 91*b* composed of SiO$_2$. The clad film 91$f$ is also composed of a material having an effective refractive index lower than that of the DBR 91$a$. Preferably, the clad film 91$f$ has a thickness which desirably ranges from λ/4n to 3.0 μm, in which λ denotes a wavelength of the light generated in the active layer 40, and n denotes a refractive index of a material composing the clad film 91$f$. By way of example, the clad film 91$f$ can be composed of a dielectric such as SiO$_2$ having a refractive index of 1.46. When λ is 450 nm (4500 Å), the clad film 91$f$ can be formed in a thickness of 771 Å (4500/4×1.46=771 Å) or more. Considering that the top layer of the DBR 91$a$ made of multiple pairs of SiO$_2$/TiO$_2$ can be composed of a SiO$_2$ layer having a thickness of λ/4n, it is desirable that the clad film 91$f$ is thicker than λ/4n to be distinguished from the top layer of the DBR 91$a$ that is placed beneath the clad film 91$f$. Although it is not desirable for the top layer of the DBR 91$a$ to be too thick (e.g., 3 μm or more), imposing a burden on the subsequent boring process and only increasing the material cost without contributing to the improvement of the efficiency, it is not impossible, depending on the case, to make the top layer as thick as 3.0 μm or more. When the DBR 91$a$ comes in a direct contact with the p-side electrode 92 and the n-side electrode 80, part of the light travelling through the DBR 91$a$ might be affected by the p-side electrode 92 and the n-side electrode 80 and then absorbed. However, interposing the clad film 91$f$ having a refractive index lower than that of the DBR 91$a$ between the p- and n-side electrodes (92, 80) and the DBR 91$a$ can minimize the partial absorption of the light traveling through the DBR 91$a$ by the p-side electrode 92 and the n-side electrode 80, thereby increasing the efficiency of light extraction. Accordingly, the clad film 91$f$ should generally have at least a thickness corresponding to the wavelength of light to achieve the effect described above, and therefore it preferably has a thickness of at least λ/4n. Meanwhile, if there is a big difference between the refractive index of the DBR 91$a$ and the refractive index of the clad film 91$f$, the DBR 91$a$ may restrict light more strongly such that a thinner clad film 91$f$ could be used. However, if the difference between the refractive indices is small, the clad film 91$f$ is needed to be sufficiently thick to obtain the effect described above. Thus, the thickness of the clad film 91$f$ is determined with full consideration of a difference between the refractive index of a material constituting the clad film 91$f$ and the effective refractive index of the DBR 91$a$. For instance, if the clad film 91$f$ is composed of SiO$_2$ and the DBR 91$a$ is composed of SiO$_2$/TiO$_2$, a suitable thickness for the clad film 91$f$ will be at least 0.3 μm to be distinguished from the top layer of the DBR 91$a$ composed of SiO$_2$. On the other hand, the upper limit of the thickness of the clad film 91$f$ is preferably between 1 μm and 3 μm, not to impose any burden on the subsequent boring process.

The clad film 91$f$ is not particularly limited as long as its refractive index is lower than the effective refractive index of the DBR 91$a$, and can be composed of a metal oxide such as Al$_2$O$_3$, a dielectric film such as SiO$_2$ or SiON, or other material such as MaF or CaF. If a difference in the refractive indices is small, the clad film should be made thicker to obtain the desired effect. Also, in case of using SiO$_2$ for the clad film, it is possible to use SiO$_2$ having a refractive index lower than 1.46 to increase the efficiency.

One can envisage that the dielectric film 91$b$ can be omitted from the non-conductive reflective film 91. Although not desirable in terms of an optical waveguide, there is no reason to exclude the configuration of the non-conductive reflective film 91 composed of the DBR 91$a$ and the clad film 91$f$, when the overall technical spirit of the present disclosure is taken into consideration. Also one can envisage that the non-conductive reflective film 91 may have a TiO$_2$ dielectric film in replace of the DBR 91$a$. Further, one can envisage that the clad film 91$f$ can be omitted from the non-conductive reflective film 91, if the DBR 91$a$ includes a SiO$_2$ layer on the top thereof.

The non-conductive reflective film 91, which is composed of the DBR 91$a$ having a high effective reflectance, and the dielectric film 91$b$ and the clad film 91$f$, each having a low reflectance, disposed on the top and bottom of the DBR 91$a$, respectively, serves as an optical waveguide, and preferably has an overall thickness ranging from of 3 μm to 8 μm. Also, the non-conductive reflective film 91 preferably has an inclined face 91$m$ at the edge. This inclined face 91$m$ can be formed, for example, by a dry etching process. Among light lays that are incident on the non-conductive reflective film 91 that serves as an optical waveguide, the light rays that are incident on the non-conductive reflective film 91 at right angles or almost at right angles are well reflected towards the substrate 10, but some light rays including those that are incident on the non-conductive reflective film 91 at an oblique angle are not reflected towards the substrate 10 and instead can be trapped inside the DBR 91$a$ that serves as a propagation part, and then can be propagated towards the lateral face. As such, the light rays propagated towards the lateral surface of the DBR 91$a$ are either emitted to the outside or reflected towards the substrate 10, at the inclined face 91$m$ of the edge of the non-conductive reflective film 91. That is to say, the inclined face 91$m$ at the edge of the non-conductive reflective film 91 serves as a corner reflector and contributes to the improved luminance of the semiconductor light emitting device. The inclined face 91$m$ is suitably at an angle ranging from 50 to 70 degrees, to facilitate the light reflection towards the substrate 10. The inclined face 91$m$ can easily be formed by wet etching or dry etching, or both.

Figure 20:
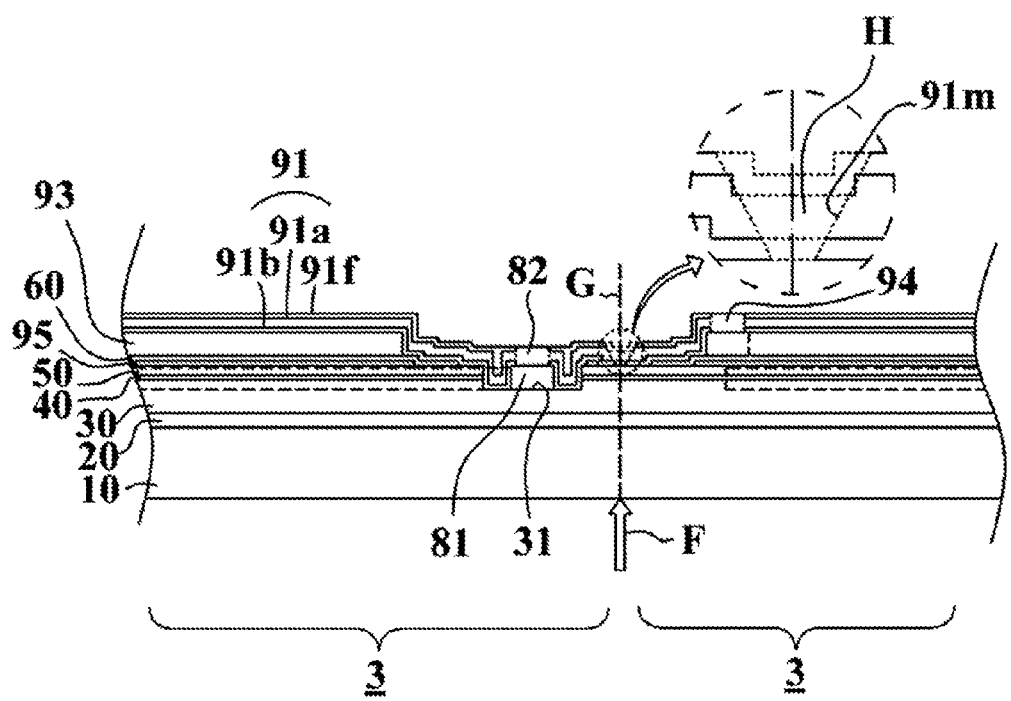
FIG. 20 is a view illustrating a state of two semiconductor light emitting devices before they are divided into individual semiconductor light emitting devices, during the manufacturing process of a semiconductor light emitting device.
Figure 21:
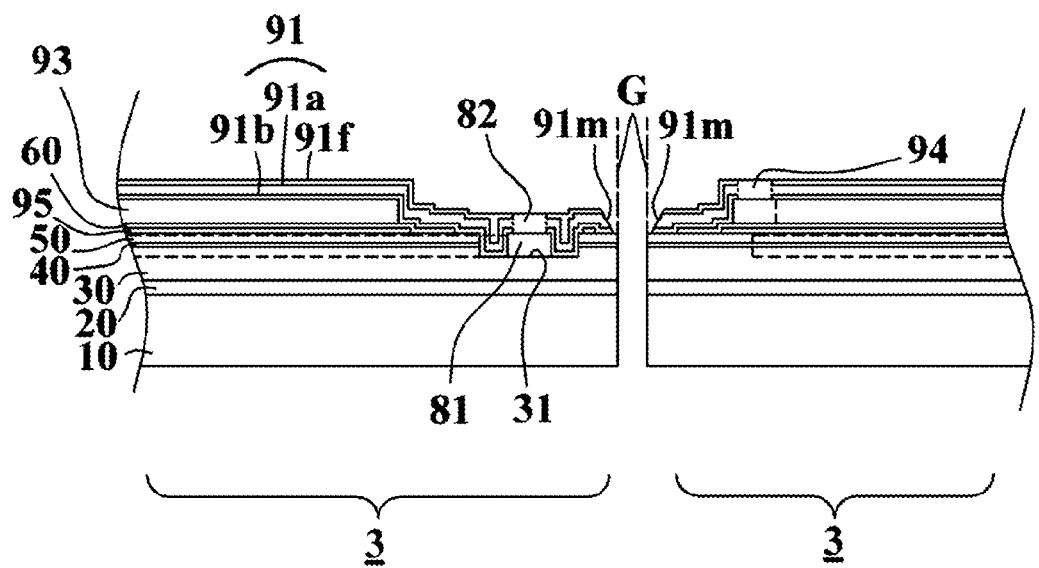
FIG. 21 is a view illustrating a state of two semiconductor light emitting devices after they are divided into individual semiconductor light emitting devices, during the manufacturing process of a semiconductor light emitting device.

FIG. 20 is a view illustrating a state of two semiconductor light emitting devices before they are divided into individual semiconductor light emitting devices, during the manufacturing process of a semiconductor light emitting device; and FIG. 21 is a view illustrating a state of two semiconductor light emitting devices after they are divided into individual semiconductor light emitting devices, during the manufacturing process of a semiconductor light emitting device. For reference, those semiconductor light emitting devices 3, shown in FIG. 20 and FIG. 21 for explaining the manufacturing process, are in a state where none of the p-side electrode 92, n-side electrode 80 and bonding pad 97 is formed.

Usually a semiconductor light emitting device is first prepared in a wafer form including a plurality of semiconductor light emitting devices, and then divides into individual semiconductor light emitting devices by cutting, such as breaking, sawing, or scribing-and-breaking. In the scribing-and-breaking operation, the scribing process employs a laser and can be performed by focusing the laser onto the substrate side including the surface and the interior of the substrate of the semiconductor light emitting device. In this scribing process employing the laser, the semiconductor light emitting device 3 is preliminarily cut along the boundary G of the edge of the semiconductor light device 3, i.e., along the boundary G between the semiconductor light emitting device 3 and another neighboring semiconductor light emitting device 3. These preliminarily cut semiconductor light emitting device 3 is completely divided into individual semiconductor light emitting devices through the breaking process that is performed following the scribing process. The breaking process is performed by applying an external force along the boundary G between the semiconductor light emitting device 3 and another neighboring semiconductor light emitting device 3, for example, in the direction of the substrate 10 indicated by an arrow F in FIG. 20, or in the opposite direction thereof. In this breaking process, the substrate 10 and the semiconductor layers 20, 30 40 and 50, which are crystalline, can be cut precisely along the boundary G; while the non-conductive reflective film 91 over the p-type semiconductor layer 50, which is non-crystalline, cannot be cut precisely along the boundary G and, in the areas around the edge of the non-conductive reflective film 91, it is likely to sustain damage such as crack generation thereto. The damage of the areas around the edge of the non-conductive reflective film 91 may lead to poor yields due to those appearance defects. Preferably, during the manufacturing of a semiconductor light emitting device, a plurality of semiconductor light emitting devices is prepared in a wafer form, and then, prior to the scribing and braking processes using a laser for dividing the semiconductor light emitting devices into individual ones, a certain area H of the non-conductive reflective film 91 around the boundary G between a semiconductor light emitting device and another neighboring semiconductor light emitting device is eliminated. In terms of the individual semiconductor light emitting device, the certain area H of the non-conductive reflective film 91 to be eliminated along the boundary G of the semiconductor light emitting device 3 corresponds to an edge area of the non-conductive reflective film 91. The elimination of a certain area H of the non-conductive reflective film 91 around the boundary G can also indicate that, before the semiconductor light emitting devices is divides into individual ones, the non-conductive reflective film 91 of one semiconductor light emitting device and the non-conductive reflective film 91 of another neighboring semiconductor light emitting device are spaced apart from each other. With a part of the areas of the edge of the non-conductive reflective film 91 being eliminated, even if the subsequent scribing and breaking processes may be performed using a laser, the appearance defect caused by the damaged edge of the non-conductive reflective film 91 of each semiconductor light emitting device can be avoided, thereby increasing yields. For example, the elimination of a certain area H of the non-conductive reflective film 91 can be carried out by dry etching, and it should be performed prior to the breaking process in the overall semiconductor manufacturing process. However, when the openings passing through the non-conductive reflective film 91 to form electrical connections 94 and 82 are formed by dry etching, it is preferable to perform the elimination at the same time. Although the inclined face 91*m* serving as a corner reflector can be obtained by a separate etching process, the inclined face 91*m* can be formed simultaneously in a process of eliminating the edge area of the non-conductive reflective film 91 to avoid damage, by etching the edge portion of the non-conductive reflective film 91 of an individual semiconductor light emitting device.

As shown in FIG. 17 and FIG. 19, a bonding pad 97 can be present on the p-side electrode 92 and on the n-side electrode 80 respectively, as a part of each of the p-side electrode 92 and the n-side electrode 80. The top face of the bonding pad 97 on the p-side electrode 92 has the same height as the top face of the bonding pad 97 on the n-side electrode 80. That is to say, the top face of the bonding pad 97 on the p-side electrode 92 and the top face of the bonding pad 97 on the n-side electrode 80 are on the same plane.

When a semiconductor light emitting device is coupled with external equipment by, for example, the eutectic bonding method, those bonding pads 97 allow the p-side electrode 92 and the n-side electrode 80 to have an equal final height to thus avoid any tilting on the mounting part, provide a broad and planar coupling face to thus obtain an excellent bonding strength, and emits the heat from the inside of the semiconductor light emitting device to the outside. A plurality of bonding pads 97 can be present on the p-side electrode 92 and on the n-side electrode 80, respectively, and the plurality of bonding pads 97 are preferably formed on the positions where the n-side finger electrodes 81 and the p-side finger electrodes 93 are not overlapped, i.e., among the n-side finger electrodes 81 and the p-side finger electrodes 93. In other words, the bonding pads 97 are formed on the areas of the p-side electrode 92 and on the n-side electrode 80, except on the p-side finger electrodes 93 corresponding to the upper most protruded portion and on the n-side finger electrodes 81 corresponding to the lower most recessed portion. In addition, the bonding pad 97 can have a double layer structure including an underlying spacer layer 97*a* and a bonding layer 97*b* overlying the spacer layer 97*a*, and has a total thickness ranging from 5 μm to 6 μm, for example. In one example, the spacer layer 97*a* may be composed of a metal layer including Ni, Cu or a combination thereof, and the bonding layer 97*b* may be composed of a eutectic bonding layer including a Ni/Sn, Ag/Sn/Cu, Ag/Sn, Cu/Sn or Au/Sn combination and having a thickness of about several μm. The spacer layer 97*a* can serve as a wetting layer and as a diffusion barrier for a solder used in the eutectic bonding, and can also reduce the cost burden as compared with a case where the bonding pad 97 is entirely formed of a eutectic bonding layer 97*b* containing expensive Au. To match the final height of the bonding faces during bonding (e.g., eutectic bonding), the bonding pads 97 is preferably formed to be taller than the most protruded portion of the p- and n-side electrodes 92 and 80, namely, the height of the upper portion of the p-side finger electrode, by 1 to 3 μm. Accordingly, during the bonding operation, excellent bonding results are obtained between the semiconductor light emitting device and the mounting part, and heat emission of the semiconductor light emitting device is facilitated. Here, the spacer layer 97*a* and the bonding layer 97*b* can be formed by various methods, such as plating, E-beam evaporation, thermal evaporation or the like.

Referring back to FIG. 14 and FIG. 15, all areas of the n-type semiconductor layer 30, except the n-side contact area 31, is preferably covered with the active layer 40 and the p-type semiconductor layer 50. That is to say, for the semiconductor light emitting device 100, the target etching area is limited to the n-side contact area 31, and there is no other area including the edges to be etched. Those lateral faces around the semiconductor light emitting device 100 are all cut faces obtained by the scribing-and-braking process or the like. As such, the area of the active layer 40 generating light increases and the light extraction efficiency is thus improved. Moreover, the step faces produced from the etching process are minimized; namely, those step faces are limited to the exposed lateral faces of the active layer 40 and the p-type semiconductor layer 50 that connect the top face of the p-type semiconductor layer 50 with the top face of the n-side contact area 31. These exposed lateral faces of the active layer 40 and the p-type semiconductor layer 50 are the portions where it is hard, in particular, to deposit the DBR 91*a* constituting the non-conductive reflective film 91 during the formation of the non-conductive reflective film 91. Consequently, the DBR 91*a* on the exposed lateral faces of the active layer 40 and the p-type semiconductor layer 50 may have relatively lower reflection efficiency. By minimizing the exposed lateral faces of the active layer 40 and the p-type semiconductor layer 50, it is possible to minimize areas having low reflection efficiency in the DBR 91a, thereby increasing the reflection efficiency as a whole.

According to one semiconductor light emitting device according to the present disclosure, it is possible to realize a new form of a reflective film structure.

According to another semiconductor light emitting device according to the present disclosure, it is possible to realize a new form of a flip-chip.

According to still another semiconductor light emitting device according to the present disclosure, it is possible to realize a reflective film structure that incorporates finger electrodes.

According to yet another semiconductor light emitting device according to the present disclosure, it is possible to embody a flip-chip that incorporates a finger electrode.

What is claimed is:

1. A semiconductor light-emitting device, comprising:
   a plurality of semiconductor layers composed of a first semiconductor layer having first conductivity, a second semiconductor layer having second conductivity different from the first conductivity, and an active layer disposed between the first semiconductor layer and the second semiconductor layer, for generating light via electron-hole recombination, wherein the plurality of semiconductor layers are grown sequentially using a growth substrate;
   a first electrode for providing either electrons or holes to the first semiconductor layer and electrically connected with the first semiconductor layer;
   a non-conductive reflective film formed over the second semiconductor layer to reflect light from the active layer towards the first semiconductor layer which is on the growth substrate side;
   a second electrode for bonding, electrically connected with the second semiconductor layer and formed over and contacted with the non-conductive reflective film for providing remaining electrons or holes to the second semiconductor layer;
   a finger electrode formed between the plurality of semiconductor layers and the non-conductive reflective film, which is extended so as to provide the remaining electrons or holes to the second semiconductor layer, which is in electrical communication with the second semiconductor layer, and which has an electrical connection for receiving the remaining electrons or holes and for connecting the finger electrode with second electrode; and
   a light-transmitting conductive film formed between the non-conductive reflective film and the second semiconductor layer, for electrically communicating the finger electrode with the second semiconductor layer;
   wherein the non-conductive reflective film comprises a distributed bragg reflector (DBR).

2. The semiconductor light emitting device as claimed in claim 1, wherein the electrical connection is formed, passing through the non-conductive reflective film from the second electrode to the finger electrode.

3. The semiconductor light emitting device as claimed in claim 1, wherein the non-conductive reflective film comprises a dielectric film underlying the DBR and having a refractive index lower than that of the second semiconductor layer.

4. The semiconductor light emitting device as claimed in claim 1, further comprising:
   a light-absorption preventing film formed below the finger electrode and between the plurality of semiconductor layers and the finger electrode, for preventing light generated from the active layer from being absorbed by the finger electrode.

5. The semiconductor light emitting device as claimed in claim 1, wherein the first electrode comprises a finger electrode which extended from the first electrode along the first semiconductor layer.

6. The semiconductor light emitting device as claimed in claim 1, further comprising:
   a light-absorption preventing film formed below the finger electrode and between the plurality of semiconductor layers and the finger electrode, for preventing light generated from the active layer from being absorbed by the finger electrode.

7. The semiconductor light emitting device as claimed in claim 6, wherein the light-absorption preventing film is composed of a light-transmitting material having a refractive index lower than that of the second semiconductor layer.

8. The semiconductor light emitting device as claimed in claim 6, wherein the light-absorption preventing film is composed of a non-conductive material.

9. The semiconductor light emitting device as claimed in claim 6, wherein the light-absorption preventing film is a light-transmitting dielectric film having a refractive index lower than that of the second semiconductor layer.

10. The semiconductor light emitting device as claimed in claim 6, wherein the light-transmitting conductive film covers the light-absorption preventing film, and the finger electrode lies on the light-transmitting conductive film.

11. The semiconductor light emitting device as claimed in claim 6, wherein the light-transmitting conductive film has openings to enable the non-conductive reflective film to come in contact with the plurality of semiconductor layers.

12. The semiconductor light emitting device as claimed in claim 6, wherein the finger electrode comes in contact with the light-absorption preventing film.

13. The semiconductor light emitting device as claimed in claim 1, wherein the second semiconductor layer is composed of a p-type group III nitride semiconductor.

14. The semiconductor light emitting device as claimed in claim 13, wherein the electrical connection is formed, passing through the non-conductive reflective film from the second electrode to the finger electrode.

15. The semiconductor light emitting device as claimed in claim 14, wherein the finger electrode lies on the light-transmitting conductive film.

16. The semiconductor light emitting device as claimed in claim 15, wherein the first electrode comprises a finger electrode which extended from the first electrode along the first semiconductor layer.

* * * * *